(12) United States Patent
Yang et al.

(10) Patent No.: US 12,340,982 B2
(45) Date of Patent: Jun. 24, 2025

(54) METHOD FOR PLASMA-ASSISTED AND MULTI-STEP CONTINUOUS PREPARATION OF DIFFUSION LAYER/AMORPHOUS CARBON FILM COMPOSITE COATING AND USE THEREOF

(71) Applicant: ANHUI UNIVERSITY OF TECHNOLOGY, Ma'anshan (CN)

(72) Inventors: Yang Yang, Ma'anshan (CN); Shihong Zhang, Ma'anshan (CN); Jun Zheng, Ma'anshan (CN); Jie Li, Ma'anshan (CN); Jinming Xie, Ma'anshan (CN)

(73) Assignee: ANHUI UNIVERSITY OF TECHNOLOGY, Ma'anshan (CN)

( * ) Notice: Subject to any disclaimer, the term of this patent is extended or adjusted under 35 U.S.C. 154(b) by 0 days.

(21) Appl. No.: 18/238,426

(22) Filed: Aug. 25, 2023

(65) Prior Publication Data
US 2024/0071726 A1   Feb. 29, 2024

(30) Foreign Application Priority Data
Aug. 25, 2022   (CN) .......................... 202211029925.X (51) Int. Cl.
| | | |
|---|---|---|
| C23C 16/02 | (2006.01) | |
| C23C 8/38 | (2006.01) | |
| C23C 16/26 | (2006.01) | |
| C23C 16/50 | (2006.01) | |
| H01J 37/32 | (2006.01) | |

(52) U.S. Cl.
CPC .... *H01J 37/32449* (2013.01); *C23C 16/0227* (2013.01); *C23C 16/0254* (2013.01); *C23C 16/26* (2013.01); *C23C 16/50* (2013.01); *C23C 8/38* (2013.01); *H01J 2237/332* (2013.01)

(58) Field of Classification Search
CPC . C23C 16/0227; C23C 16/0254; C23C 16/26; C23C 16/50
See application file for complete search history.

(56) References Cited

U.S. PATENT DOCUMENTS

| | | | |
|---|---|---|---|
| 2009/0029067 A1* | 1/2009 | Sciamanna | ............. C23C 16/26 427/577 |
| 2016/0281216 A1* | 9/2016 | Shibusawa | .......... C23C 16/0272 |
| 2018/0023187 A1* | 1/2018 | Binder | .................. C23C 28/046 428/332 |

* cited by examiner

*Primary Examiner* — Kelly M Gambetta
(74) *Attorney, Agent, or Firm* — Nitin Kaushik (57) ABSTRACT

The present disclosure relates to the technical field of composite coating preparation, in particular to a method for plasma-assisted and multi-step continuous preparation of a diffusion layer/amorphous carbon film composite coating and use thereof. In the present disclosure, a high-temperature plasma carburizing/nitriding technology and a low-temperature plasma carbon coating technology are combined by a plasma activation technology with argon ion under gradient cooling, and the surface of a material is activated by multiple bombardment on the surface of the material with high-energy argon ions. In this way, a cluster-like porous and loose structure on a surface of the diffusion layer is removed. In summary, the multi-step continuous preparation of the diffusion layer/amorphous carbon film composite coating is formed based on an integrated technology of the high-temperature plasma diffusion with nitrogen/carbon ion and plasma activation with argon ion under gradient cooling and plasma coating with low-temperature carbon ion.

1 Claim, 10 Drawing Sheets

METHOD FOR PLASMA-ASSISTED AND MULTI-STEP CONTINUOUS PREPARATION OF DIFFUSION LAYER/AMORPHOUS CARBON FILM COMPOSITE COATING AND USE THEREOF

CROSS REFERENCE TO RELATED APPLICATION

This patent application claims the benefit and priority of Chinese Patent Application No. 202211029925.X, filed with the China National Intellectual Property Administration on Aug. 25, 2022, the disclosure of which is incorporated by reference herein in its entirety as part of the present application.

TECHNICAL FIELD

The present disclosure relates to the technical field of composite coating preparation, in particular to a method for plasma-assisted and multi-step continuous preparation of a diffusion layer/amorphous carbon film composite coating and use thereof.

BACKGROUND

Diamond-like carbon (DLC) film is a hard coating with low coefficient of friction, high wear resistance, and chemical inertness. Such an amorphous carbon film is extremely attractive as a solid lubricating film. However, due to a high internal stress in the coating and a large difference in thermal expansion coefficient between the coating and a substrate, the DLC film is easy to fall off from the substrate during use, thus seriously restricting practical applications of this film. Plasma carburizing/nitriding and carbon film plasma deposition can be integrated through technologies to realize a multi-step technology of preparing diffusion layer and film composite layer to improve the tribological properties of a workpiece. However, in the technical integration of the plasma carburizing/nitriding and carbon film plasma deposition, high surface roughness and low activity after plasma carburizing/nitriding lead to poor quality and low growth efficiency of the subsequently deposited carbon film.

Through long-term research and practices of the inventor, the present disclosure is provided to overcome the above defects.

SUMMARY

An objective of the present disclosure is to solve that in the technical integration of the plasma carburizing/nitriding and carbon film plasma deposition, high surface roughness and low activity after plasma carburizing/nitriding lead to poor quality and low growth efficiency of the subsequently deposited carbon film. The present disclosure provides a method for plasma-assisted and multi-step continuous preparation of a diffusion layer/amorphous carbon film composite coating and use thereof.

In order to achieve the above objective, the present disclosure provides a method for plasma-assisted and multi-step continuous preparation of a diffusion layer/amorphous carbon film composite coating, including the following steps:

S1, substrate pretreatment: polishing a surface of a substrate steel material to a mirror surface with sandpaper, and cleaning in alcohol and an acetone solution for later use;

S2, plasma diffusion with high-temperature carbon/nitrogen ion: putting a sample obtained in step S1 into a plasma chemical heat treatment furnace to allow diffusion, introducing hydrogen or argon and heating, introducing a source gas for the diffusion after a set temperature is achieved, controlling a gas pressure and a flow rate of the source gas, and conducting heat preservation of the diffusion;

S3, plasma activation with argon ion under gradient cooling: after the heat preservation of the diffusion in step S2 is completed, stopping introducing the source gas for the diffusion, introducing argon while controlling a flow rate and a pressure of the argon, gradually reducing the flow rate and the pressure of the argon, reducing a voltage, and realizing argon ion bombardment while a furnace temperature is lowered;

S4, film plasma deposition with low-temperature carbon ion: when the furnace temperature drops to not more than 200° C., applying the voltage, introducing a carbon source gas and hydrogen, controlling a gas pressure and flow rates of the carbon source gas and the hydrogen, depositing an amorphous carbon film, cooling the sample to a room temperature with the furnace after the depositing is completed, and taking out the sample.

Further, the plasma diffusion with the high-temperature carbon/nitrogen ion in step S2 is any one of plasma nitriding, plasma carburizing, plasma carbonitriding, and plasma nitrocarburizing.

Further, the diffusion in step S2 is conducted at 400° C. to 600° C.

Further, the plasma activation with the argon ion under gradient cooling in step S3 includes multi-step plasma activation with the argon ion having the following stages:

S31, conducting plasma activation at a flow rate of the argon of 15 sccm to 25 sccm, a gas pressure of 100 Pa to 140 Pa, and a voltage of 750 V to 800 V for 30 min to 60 min;

S32, conducting plasma activation at a flow rate of the argon of 10 sccm to 20 sccm, a gas pressure of 80 Pa to 120 Pa, and a voltage of 700 V to 750 V for 30 min to 60 min;

S33, conducting plasma activation at a flow rate of the argon of 5 sccm to 15 sccm, a gas pressure of 50 Pa to 100 Pa, and a voltage of 650 V to 700 V for 30 min to 60 min; and S34, conducting plasma activation at a flow rate of the argon of less than 10 sccm, a gas pressure of 30 Pa to 80 Pa, and a voltage of not more than 600 V, and conducting the plasma coating with the low-temperature carbon ion in step S4 when the furnace temperature drops to not more than 200° C.

Further, the carbon source gas in step S4 is any one selected from the group consisting of methane, ethane, propane, a benzene, dimethyldichlorosilane, dimethylchlorosilane, trimethylchlorosilane, carbon monoxide, methanol, acetone, and alcohol.

Further, the depositing in step S4 is conducted at less than 200° C., a voltage of 750 V to 850 V, and a pressure of less than 100 Pa.

The present disclosure further provides a diffusion layer/amorphous carbon film composite coating prepared by the method for plasma-assisted and multi-step continuous preparation of a diffusion layer/amorphous carbon film composite coating, and use of the diffusion layer/amorphous carbon film composite coating in the field of a transmission component and a rotating component.

Compared with the prior art, the beneficial effect of the present disclosure is: in the present disclosure, a high-temperature plasma carburizing/nitriding technology and a low-temperature carbon film plasma deposition technology are combined by a plasma activation technology with argon ion under gradient cooling, and the surface of a material is activated by multiple bombardment on the surface of the material with high-energy argon ions. In this way, a cluster-like porous and loose structure on a surface of the diffusion layer is removed, such that the surface is denser and smoother, and subsequent nucleation and growth of the amorphous carbon film is promoted. This method can increase a binding force of the carbon film and improve friction and wear performance of a workpiece. In summary, the multi-step continuous preparation of the diffusion layer/amorphous carbon film composite coating is formed based on an integrated technology of the high-temperature plasma diffusion with nitrogen/carbon ion and plasma activation with argon ion under gradient cooling and film plasma deposition with low-temperature carbon ion, and can be used in the field of transmission components and rotating components such as bearings and gears.

DETAILED DESCRIPTION OF THE EMBODIMENTS

The above and other technical features and advantages of the present disclosure will be described below in more details in connection with the accompanying drawings.

Example

This example provided a plasma nitriding and plasma activation with argon ion under gradient cooling and plasma coating with low-temperature carbon ion, denoted as ND-Ar (Gra), and the preparation method included the following steps:

A surface of a bearing steel was polished to a mirror surface with sandpaper. After cleaning, the bearing steel was placed in a plasma nitriding furnace to allow nitriding. Nitrogen and hydrogen were introduced as reaction gases. The nitriding was conducted at a given voltage at 500° C. and a pressure of 200 Pa for a period of time.

After the heat preservation was over, the voltage did not stop, a value of the source gas for diffusion was closed, and 20 sccm of argon was introduced to allow bombardment and activation on the surface of a nitrided layer of the material at voltage of 780 V and a gas pressure of 120 Pa for 30 min.

Cooling was conducted with the furnace, and 15 sccm of argon was introduced to allow bombardment and activation on the surface of a nitrided layer of the material at voltage of 750 V and a gas pressure of 100 Pa for 30 min.

Cooling was conducted with the furnace, and 10 sccm of argon was introduced to allow bombardment and activation on the surface of a nitrided layer of the material at voltage of 700V and a gas pressure of 80 Pa for 30 min.

Cooling was conducted with the furnace, and 5 sccm of argon was introduced to allow bombardment and activation on the surface of a nitrided layer of the material at voltage of 600 V and a gas pressure of 60 Pa. When the temperature dropped to not more than 200° C., the voltage was increased to 800 V for the deposition of amorphous carbon film, where propane and hydrogen were fed as reaction gases. A voltage was given, the deposition was conducted at 160° C. for 5 h. After the deposition was over, the sample was cooled to room temperature with the furnace, and the sample was taken out for relevant characterization tests.

Comparative Example 1

This comparative example provided a plasma nitriding and plasma coating with low-temperature carbon ion; after plasma nitriding, the sample was cooled to not more than 200° C. for amorphous carbon film deposition, without argon ion bombardment, denoted as ND, and the preparation method included the following steps:

A surface of a bearing steel was polished to a mirror surface with sandpaper. After cleaning, the bearing steel was placed in a plasma nitriding furnace to allow nitriding. Nitrogen and hydrogen were introduced as reaction gases. The nitriding was conducted at a given voltage at 500° C. and a pressure of 200 Pa for a period of time. After the heat preservation was over, the voltage was stopped, and a small amount of nitrogen was introduced as a protective gas to prevent oxidation of the sample.

When the temperature dropped to not more than 200° C., the voltage was applied to allow the deposition of amorphous carbon film, where propane and hydrogen were fed as reaction gases. A voltage was given, the deposition was conducted at 160° C. for 5 h. After the deposition was over, the sample was cooled to room temperature with the furnace, and the sample was taken out for relevant characterization tests.

Comparative Example 2

This comparative example provided a plasma nitriding and plasma activation with argon ion under non-gradient cooling and plasma coating with low-temperature carbon ion, denoted as ND-Ar, and the preparation method included the following steps:

A surface of a bearing steel was polished to a mirror surface with sandpaper. After cleaning, the bearing steel was placed in a plasma nitriding furnace to allow nitriding. Nitrogen and hydrogen were introduced as reaction gases. The nitriding was conducted at a given voltage at 500° C. and a pressure of 200 Pa for a period of time.

After the heat preservation was over, the voltage did not stop, a value of the source gas for diffusion was closed, and 20 sccm of argon was introduced to allow bombardment and activation on the surface of a nitrided layer of the material at voltage of 780 V and a gas pressure of 120 Pa for 30 min. After the sputtering was over, the voltage was stopped, and a small amount of nitrogen was introduced as a protective gas to prevent oxidation of the sample.

When the temperature dropped to not more than 200° C., the voltage was applied to allow the deposition of amorphous carbon film, where propane and hydrogen were fed as reaction gases. A voltage was given, the deposition was conducted at 160° C. for 5 h. After the deposition was over, the sample was cooled to room temperature with the furnace, and the sample was taken out for relevant characterization tests.

Figure 1:
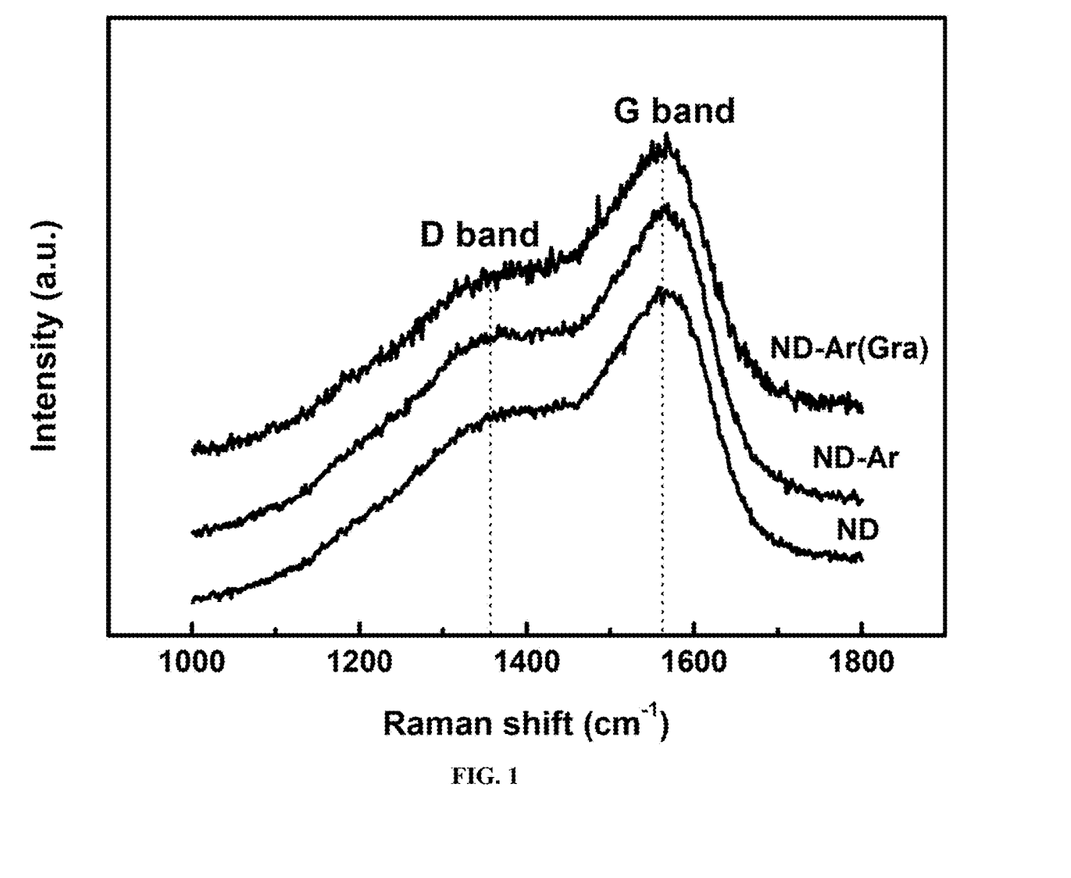
FIG. 1 shows results of a Raman test of amorphous carbon films in Example and Comparative Examples 1 and 2.

ND, ND-Ar, and ND-Ar (Gra) composite layers prepared in Comparative Examples 1 and 2 and Example were characterized as follows: the carbon film was tested by a Raman spectrometer to analyze carbon atom bonding composition, as shown in FIG. 1. FIG. 1 showed Raman spectra of the amorphous carbon films in Example and Comparative Examples 1 and 2, and the results showed that there were obvious D peaks and G peaks, which were typical characteristics of the amorphous carbon film.

Figure 2:
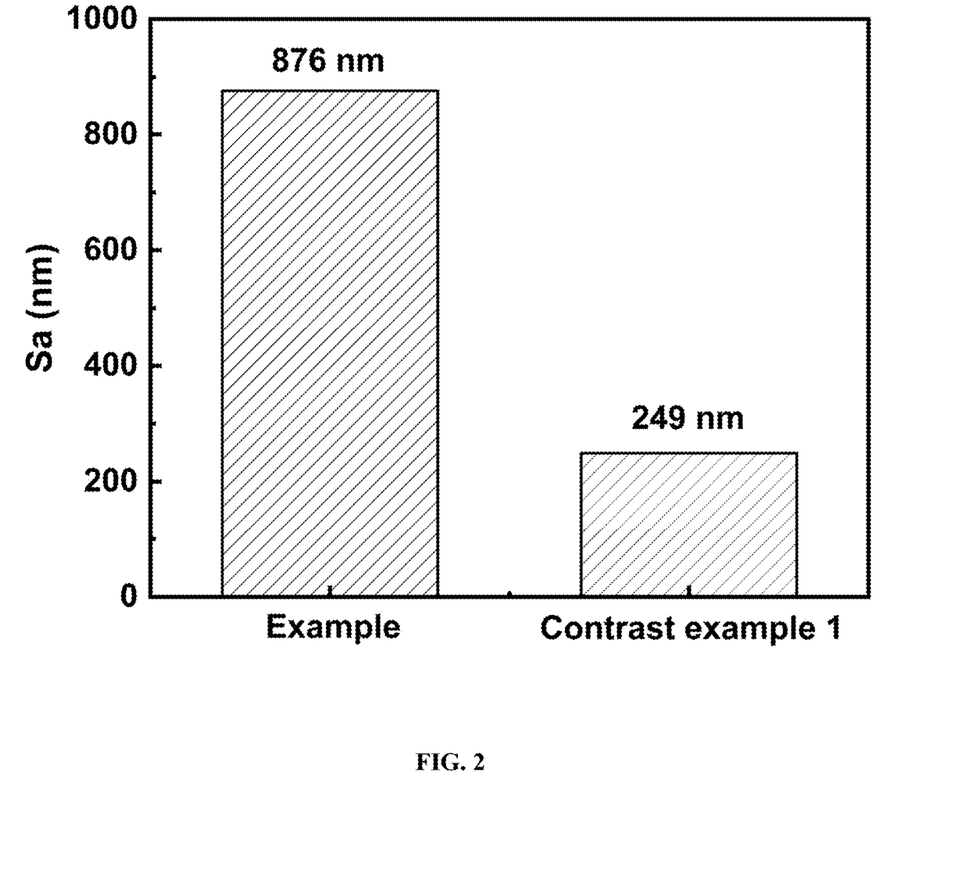
FIG. 2 shows test results of a surface appearance of composite layers of Example and Comparative Example 1.

The surface roughness of the composite layer was tested using a probe-type profile stress meter. The size of the selected area on the sample surface was 500 μm×500 μm, and the roughness Sa value was calculated by 3D fitting with a scanning speed of 10 μm/s, as shown in FIG. 2. FIG. 2 showed surface appearance and roughness of the composite layers of Example and Comparative Example 1, where the left was the composite layer of ND in the comparative example, and the right was the composite layer of ND-Ar (Gra) in the example. The surface appearance of ND without $Ar^+$ bombardment and activation had more cluster-like and large protrusions, and the roughness was correspondingly higher, reaching Sa=876 nm. The large protrusions on the surface of ND-Ar(Gra) treated by $Ar^+$ bombardment and activation under gradient cooling were significantly reduced, and the roughness was reduced to Sa=249 nm. This indicated that the $Ar^+$ bombardment and activation under gradient cooling could eliminate the large cluster structures on the surface after nitriding, making the surface more smooth and compact, which was beneficial to the nucleation and growth of amorphous carbon film.

Figure 3A:
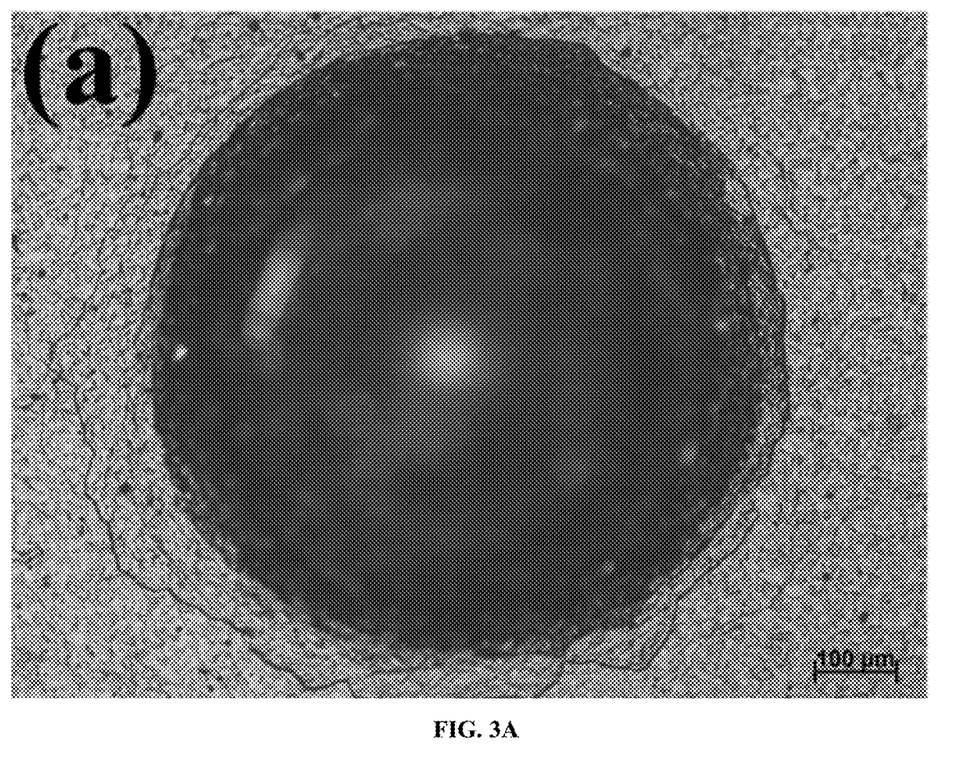
FIGS. 3A-B show test results of Rockwell indentation of composite layers of Example and Comparative Example 1.
Figure 3B:
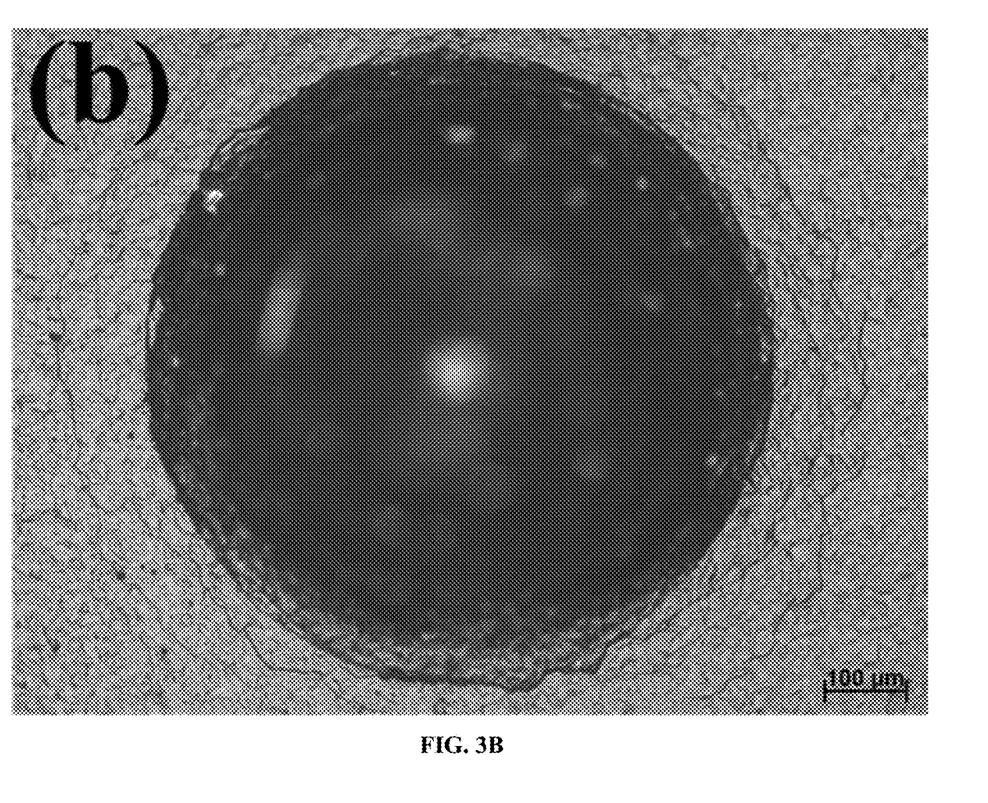

A bonding force between the carbon film and the substrate was determined by a Rockwell indentation method and an indentation morphology, and the pressure was 1,500 N, as shown in FIGS. 3A-B. FIGS. 3A-B showed the Rockwell indentation metallography of the composite layers of Example and Comparative Example 1, where FIG. 3A was the composite layer of ND in the comparative examples, and FIG. 3B was the composite layer of ND-Ar (Gra) in the example. According to the VDI3198 standard, the grades of both composite coatings were HF1, and both exhibited extremely desirable adhesion. Compared with the ND-Ar (Gra) coating, the cracks at the edge of the indentation of the ND coating were wider and uneven. This showed that the $Ar^+$ bombardment and activation under gradient cooling could improve the bonding force between the carbon film and the substrate to a certain extent.

Figure 4A:
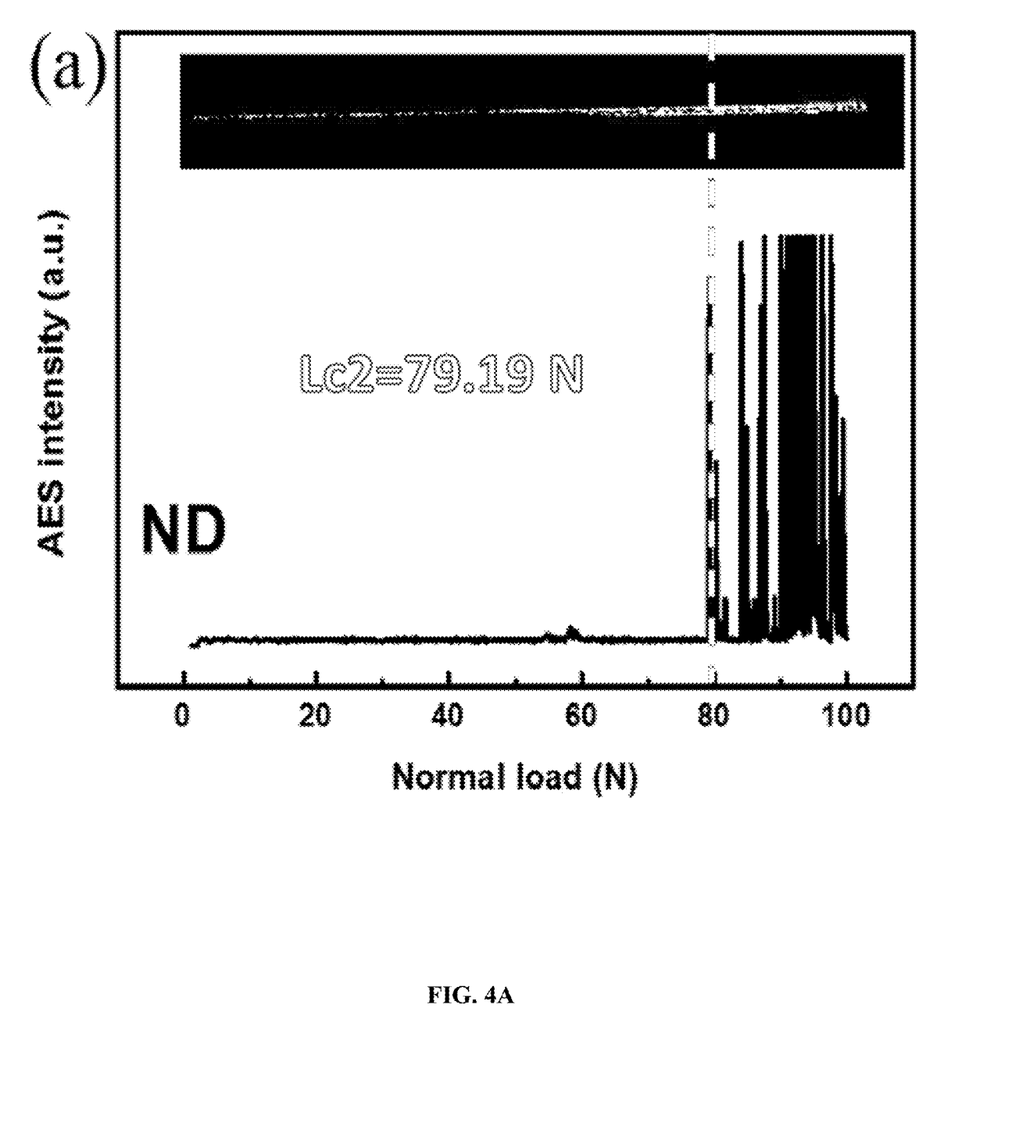
FIGS. 4A-B show scratch test results of the composite layers of Example and Comparative Example 1.
Figure 4B:
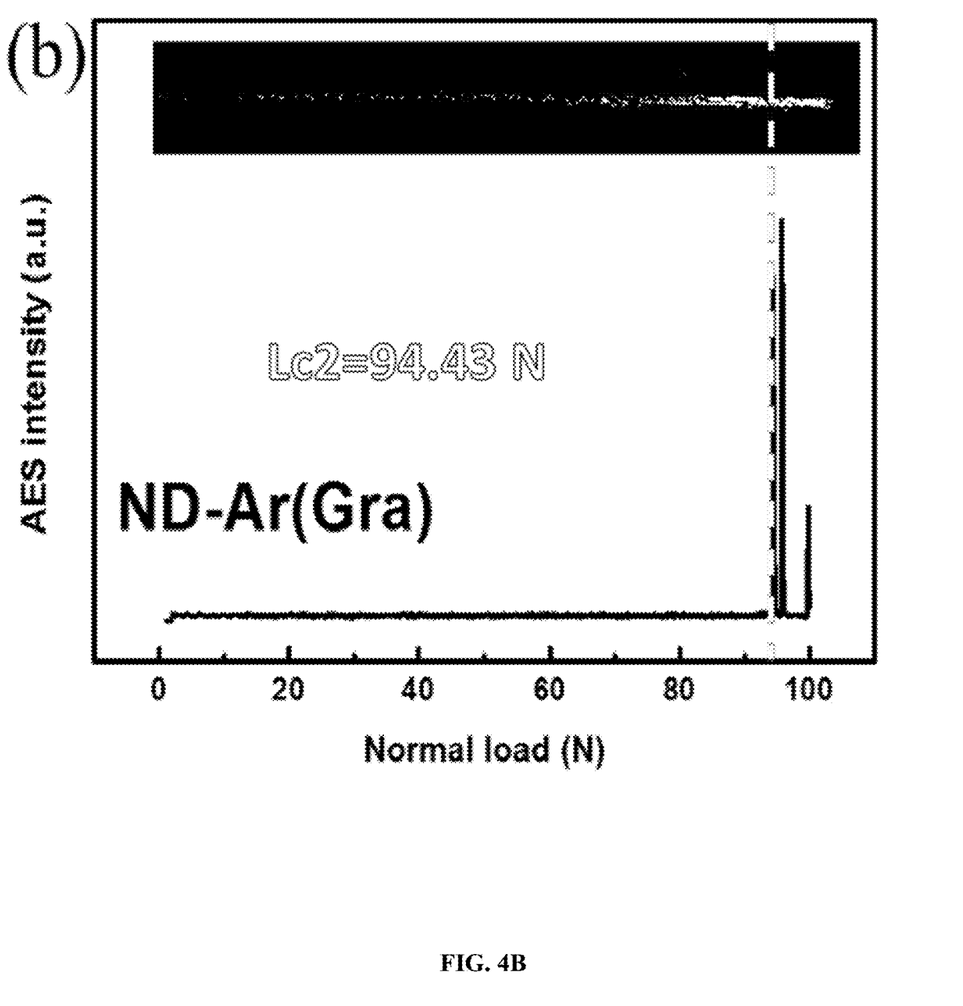
Figure 5A:
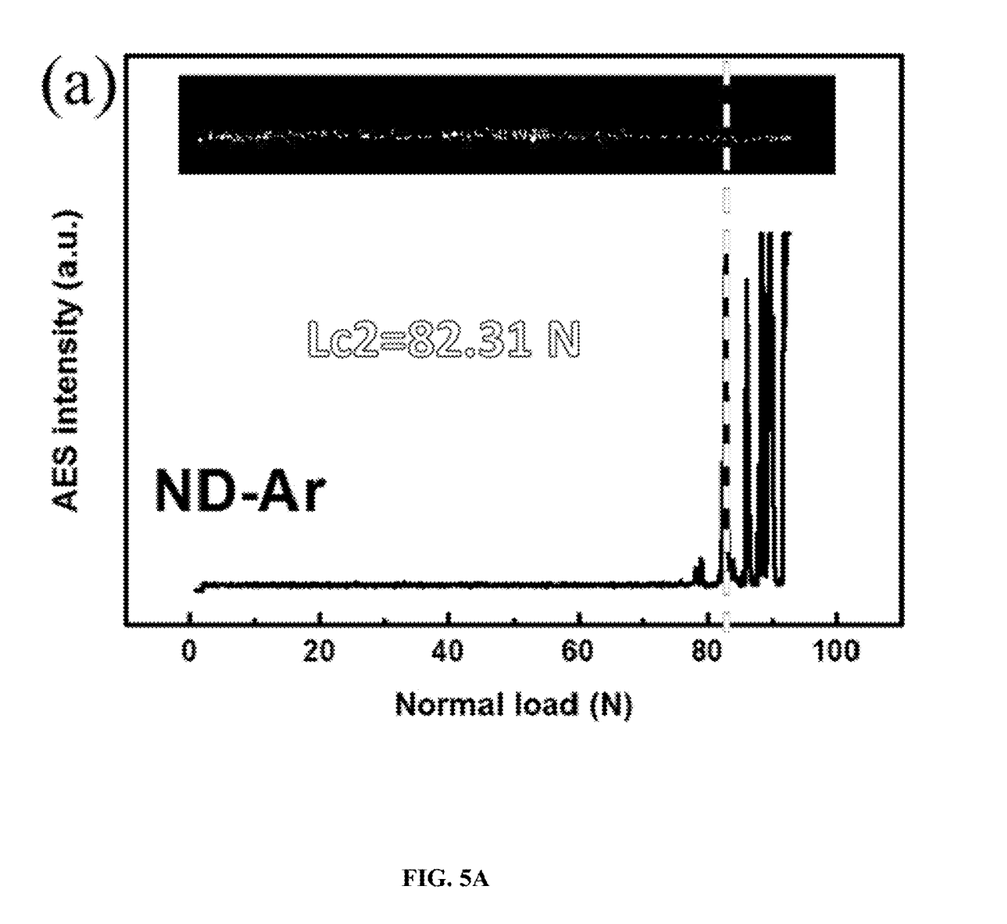
FIGS. 5A-B show scratch test results of the composite layers of Example and Comparative Example 2.
Figure 5B:
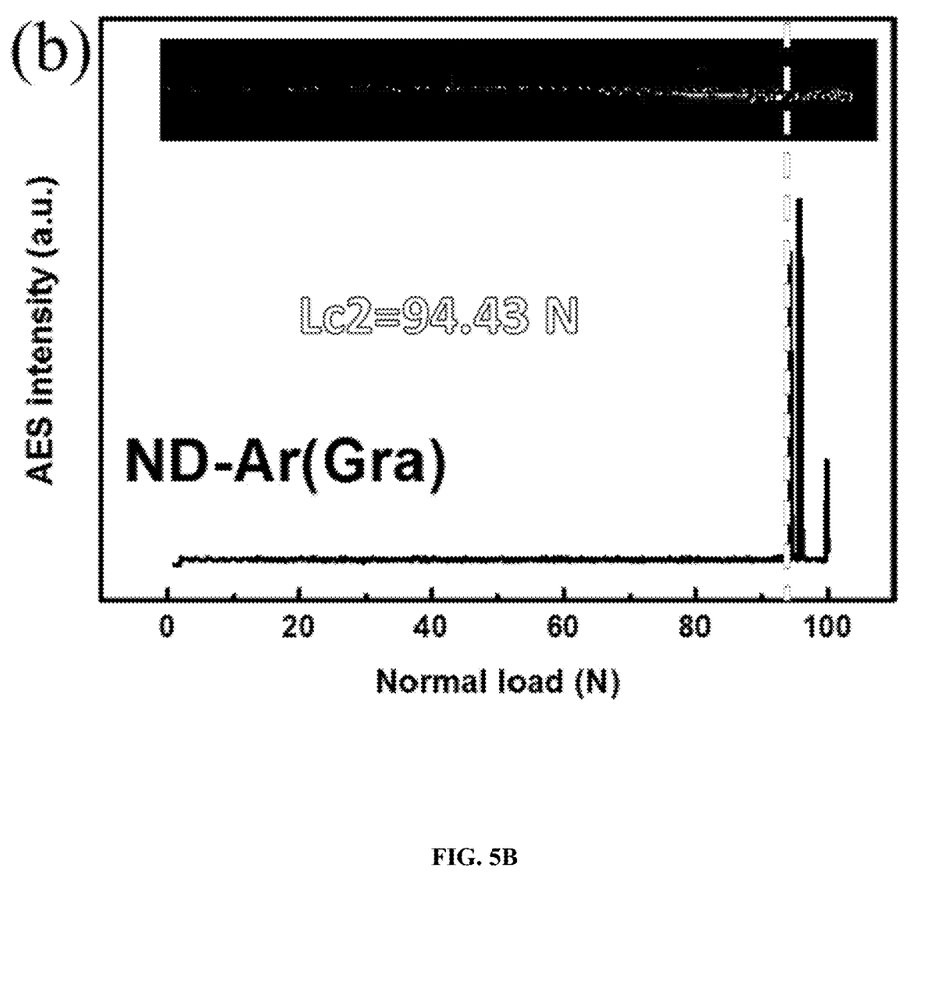

The bonding force between the carbon film and the substrate was determined by the scratch test method and the scratch morphology and the acoustic signal. A loading force was 1 N to 100 N, and a loading rate was 100 N/min, as shown in FIGS. 4A-B and FIGS. 5A-B. FIGS. 4A-B showed a scratch bonding force test result of the composite layers of Example and Comparative Example 1, where FIG. 4A was the composite layer of ND in Comparative Example 1, and a bonding strength was 79.19 N; FIG. 4B was the composite layer of ND-Ar(Gra) in Example, and a bonding strength was 94.43 N. It was seen that the binding force of Example was higher than that of Comparative Example 1, and also showed that the $Ar^+$ bombardment and activation could improve the binding force between the carbon film and the substrate. FIGS. 5A-B showed the result of the scratch bonding force test of the composite layers of Example and Comparative Example 2, where FIG. 5A was the composite layer of ND-Ar in Comparative Example 2, and a bonding strength was 82.31 N; FIG. 5B was the composite layer of ND-Ar(Gra) in Example, and a bonding strength was 94.43N. It was seen that the binding force of Example was higher than that of the Comparative Example 2, indicating that the $Ar^+$ bombardment and activation under gradient cooling was more effective in improving the binding force of the composite layer than the $Ar^+$ bombardment and activation under non-gradient cooling.

Figure 6:
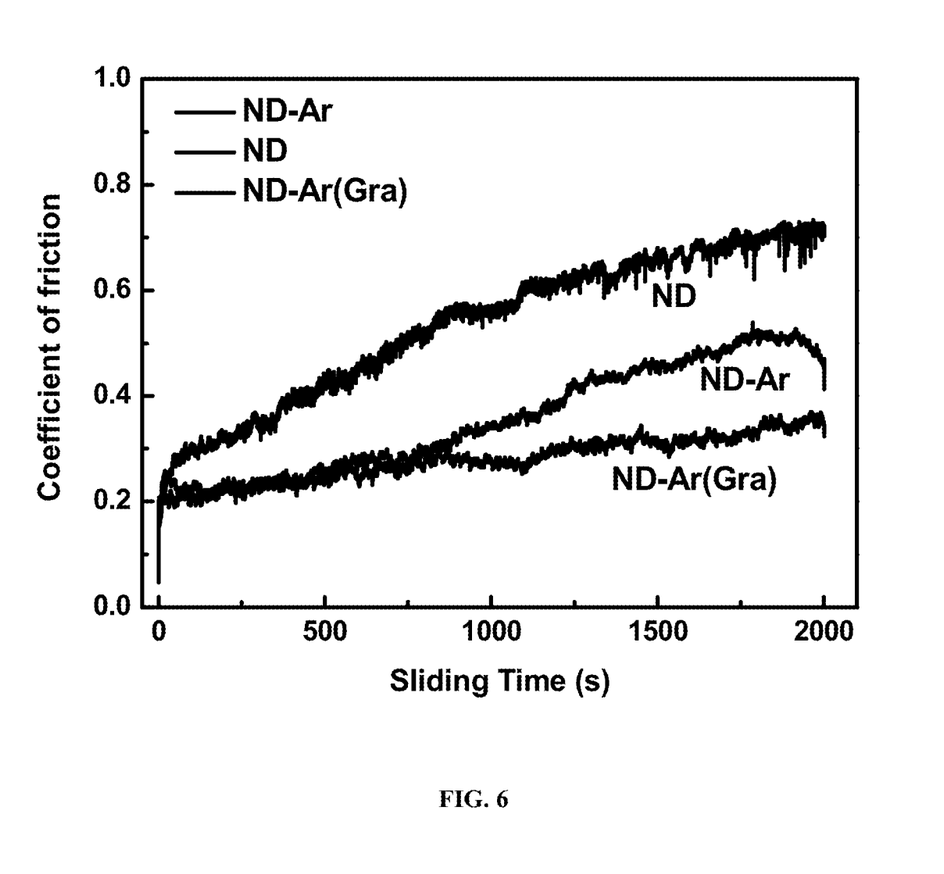
FIG. 6 shows test results of a friction coefficient of the composite layers of Example and Comparative Examples 1 and 2.
Figure 7:
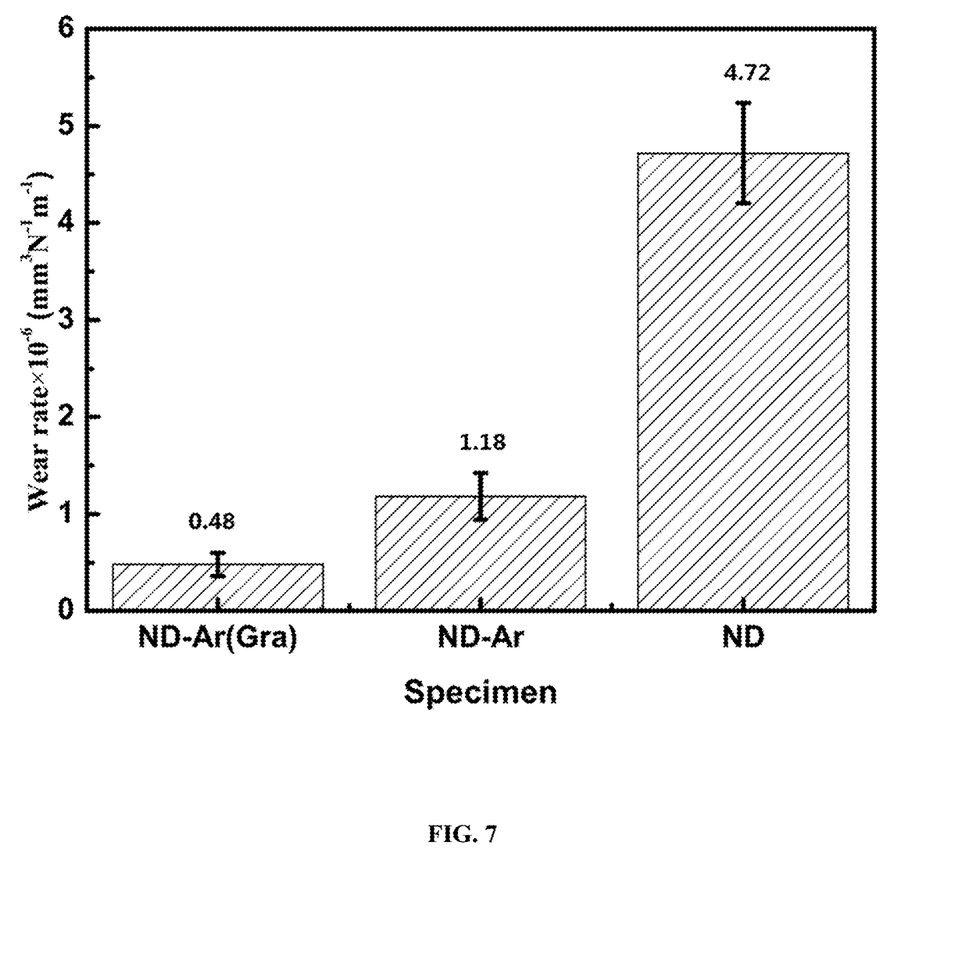
FIG. 7 shows test results of a wear rate of the composite layers of Example and Comparative Examples 1 and 2.

The wear performance of the composite layer was tested using the ball-on-disk friction and wear test equipment, where the friction pair was an alumina ball (diameter 1=6 mm), the load was 1 N, the wear radius was 2 mm, the rotation speed was 240 r/min, the time is 2,000 s, and the test temperature was room temperature. The growth of the amorphous carbon film under the two preparation methods could be determined by analyzing the change of the friction coefficient curve, as shown in FIG. 6. FIG. 6 showed a friction coefficient curve of the composite layers of Embodiment and Comparative Examples 1 and 2. It was seen from the figure that the friction coefficient of the composite layer of ND in Comparative Example 1 was significantly higher than that of the composite layer of ND-Ar(Gra) in Example. This was mainly due to the thicker carbon film thickness of the composite layer of ND-Ar(Gra), thus confirming the effect of the $Ar^+$ bombardment and activation under gradient cooling of the present disclosure on improving the deposition of the hydrogen-containing amorphous carbon film. The friction coefficient of the composite layer of ND-Ar in Comparative Example 2 was higher than that of the composite layer of ND-Ar(Gra) in Example, indicating that the $Ar^+$ bombardment and activation under gradient cooling was better for improving the deposition effect of the amorphous carbon film than the $Ar^+$ bombardment and activation under non-gradient cooling. The wear rate was calculated by fitting the wear scars with a probe-type profile stress meter, as shown in FIG. 7. FIG. 7 showed a calculation result of the wear rate of the composite layers of the Example and Comparative Examples 1 and 2. It was seen from the figure that the wear rate of ND was much higher than that of ND-Ar(Gra), indicating that the carbon film thickness of the composite layer of ND-Ar(Gra) was thicker, and the result of the comprehensive friction coefficient could be known. The results showed that $Ar^+$ bombardment and activation could improve the growth and deposition efficiency of amorphous carbon film. The wear rate of ND-Ar was also higher than that of ND-Ar(Gra). The comprehensive friction coefficient results showed that the $Ar^+$ bombardment and activation under gradient cooling was better than the $Ar^+$ bombardment and activation under non-gradient cooling in improving the deposition of amorphous carbon film.

The above described are merely preferred examples of the present disclosure, and are merely illustrative rather than restrictive. It is to be understood that many alterations, modifications or even equivalent replacements can be made within the spirit and scope defined by the claims of the present disclosure, and should fall within the protection scope of the present disclosure.

What is claimed is:

1. A method for plasma-assisted and multi-step continuous preparation of a diffusion layer/amorphous carbon film composite coating, the method comprising the following steps:

S1, pretreating a substrate by polishing a surface of a substrate steel material to a mirror surface, and cleaning in alcohol and an acetone solution for later use;

S2, performing plasma diffusion with high-temperature carbon/nitrogen ion by putting a sample obtained in step S1 into a plasma chemical heat treatment furnace to allow diffusion, introducing hydrogen or argon and heating, introducing a source gas for the diffusion after the heating is completed, controlling a gas pressure and a flow rate of the source gas, and conducting heat preservation of the diffusion;

S3, performing plasma activation with argon ion under gradient cooling by after the heat preservation of the diffusion in step S2 is completed, stopping introducing the source gas for the diffusion, introducing argon while controlling a flow rate and a pressure of the argon, gradually reducing the flow rate and the pressure of the argon, reducing a voltage, and realizing argon ion bombardment while a furnace temperature is lowered; and S4, performing plasma coating with low-temperature carbon ion by, when the furnace temperature drops to not more than 200° C., applying the voltage, introducing a carbon source gas and hydrogen, controlling a gas pressure and flow rates of the carbon source gas and the hydrogen, depositing an amorphous carbon film, cooling the sample to a room temperature with the furnace after the depositing is completed, and taking out the sample;

wherein the performing plasma diffusion with the high-temperature carbon/nitrogen ion in step S2 is plasma nitriding;

wherein the heat treatment furnace in step S2 is operated at 400° C. to 600° C.;

wherein the performing plasma activation with the argon ion under gradient cooling in step S3 comprises multi-step plasma activation with the argon ion having the following stages:

S31, conducting plasma activation at a flow rate of the argon of 20 sccm, a gas pressure of 100 Pa, and a voltage of 780 V for 30 min;

S32, conducting plasma activation at a flow rate of the argon of 15 sccm, a gas pressure of 100 Pa, and a voltage of 750 V for 30 min;

S33, conducting plasma activation at a flow rate of the argon of 10 sccm, a gas pressure of 80 Pa, and a voltage of 700 V for 30 min; and S34, conducting plasma activation at a flow rate of the argon of 5 sccm, a gas pressure of 60 Pa, and a voltage of 600 V, and conducting the plasma coating with the low-temperature carbon ion in step S4 when the furnace temperature drops to not more than 200° C.;

wherein the carbon source gas in step S4 is propane;

wherein the depositing in step S4 is conducted at less than 200° C., a voltage of 750 V to 850 V, and a pressure of less than 100 Pa.

* * * * *